(12) United States Patent
Hijzen et al.

(10) Patent No.: US 6,368,921 B1
(45) Date of Patent: Apr. 9, 2002

(54) MANUFACTURE OF TRENCH-GATE SEMICONDUCTOR DEVICES

(75) Inventors: Erwin A. Hijzen, Breda; Henricus G. R. Maas; Cornelius E. Timmering, both of Eindhoven, all of (NL)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/671,888

(22) Filed: Sep. 28, 2000

(30) Foreign Application Priority Data

Sep. 28, 1999 (GB) .............................. 9922764

(51) Int. Cl.⁷ .................... H01L 2/336; H01L 21/22; H01L 21/38; H01L 21/311
(52) U.S. Cl. ..................... 438/270; 438/555; 438/259; 438/700
(58) Field of Search ................. 438/530, 555, 438/287, 242, 259, 270, 700

(56) References Cited

U.S. PATENT DOCUMENTS

| 4,767,722 A | * | 8/1988 | Blanchard ..................... 437/41 |
| 4,824,797 A | * | 4/1989 | Goth ........................... 437/67 |
| 5,082,795 A | * | 1/1992 | Temple ........................ 437/41 |
| 5,378,655 A | | 1/1995 | Hutchings et al. .......... 437/203 |
| 5,972,741 A | * | 10/1999 | Kubo et al. .................. 438/138 |
| 6,087,224 A | * | 7/2000 | Luo ............................ 438/270 |
| 6,211,018 B1 | * | 4/2001 | Nam et al. ................... 438/270 |
| 6,228,698 B1 | * | 5/2001 | Luo ............................ 438/234 |

FOREIGN PATENT DOCUMENTS

WO           9403922 A1    2/1994

OTHER PUBLICATIONS

"500–V n–Channel Insulated–Gate Bipolar Transistor with a Trench Gate Structure", by H.R. Change et al., IEEE Transactions on Electron Devices, Vo. 36, Sep. 1989, No. 9–I.

* cited by examiner

Primary Examiner—Richard Elms
Assistant Examiner—Adam Pyonin
(74) Attorney, Agent, or Firm—Michael E. Marion

(57) ABSTRACT

A trench-gate semiconductor device, for example a MOSFET or IGBT, of compact geometry is manufactured with self-aligned masking techniques in a simple process with good reproducibility. The source region (13) of the device is formed by introducing dopant (63) into an area of the body region (15) via a mask window (51a), diffusing the dopant to form a surface region (13b) that extends laterally below the mask (51) at a distance (d) beyond the masking edge (51b) of the window (51a), and then etching the body (10) at the window (51a) to form a trench (20) for the trench-gate (11) with a lateral extent (y) that is determined by the etching of the body (10) at the masking edge (51b) of the window (51a). A portion of the surface region (13b) is left to provide the source region (13) adjacent to the trench (20). The invention permits the etch edge definition for the trench (2) to be better controlled by using the masking edge (51b) of a well-defined mask (51), as compared with the less well defined edges that tend to result from the use of a side-wall extension in prior-art processes.

10 Claims, 3 Drawing Sheets

US 6,368,921 B1

MANUFACTURE OF TRENCH-GATE SEMICONDUCTOR DEVICES

BACKGROUND OF THE INVENTION

This invention relates to methods of manufacturing a trench-gate semiconductor device, for example an insulated-gate field-effect power transistor (commonly termed a "MOSFET") or an insulated-gate bipolar transistor (commonly termed an "IGBT"). The invention also relates to semiconductor devices manufactured by such a method.

Such trench-gate semiconductor devices are known having source and drain regions of a first conductivity type separated by a channel-accommodating body region of the opposite second conductivity type. An advantageous method of manufacture is disclosed in United States patent U.S. Pat. No. 5,378,655 (our reference PHB 33836), in which the formation of the source region is self-aligned with the trench (also termed "groove") which comprises the gate. The self-alignment is achieved by forming a second mask from a first mask, by the provision of side-wall extensions on the first mask. These side-wall extensions act as self-aligned spacers. The whole contents of U.S. Pat. No. 5,378,655 are hereby incorporated herein as reference material. By using such techniques as disclosed in U.S. Pat. No. 5,378,655, the number of photolithographic masking steps which require separate alignment can be reduced and compact cellular device structures can be formed.

Trench-gate semiconductor devices are also known in which the channel-accommodating body region is of the same, first conductivity type as the source and drain regions. In this case, the conductive channel is formed by charge-carrier accumulation by means of the trench-gate. Similar considerations arise with respect to the doping of the regions and the etching of the trench, as in the more usual device in which the channel-accommodating region is of the opposite, second conductivity type.

SUMMARY OF THE INVENTION

It is an aim of the present invention to modify the manufacture of trench-gate semiconductor devices so as to permit the use of self-aligned masking techniques while providing a simpler process with good reproducibility for device structures that can be even more compact.

According to the present invention there is provided a method of manufacture wherein a source region is formed by introducing dopant of a first conductivity type into an area of the body region via a mask window, diffusing the dopant to form a surface region of the first conductivity type that extends laterally below the mask at a distance beyond the masking edge of the window, and then etching the body at the window to form a trench for the trench-gate with a lateral extent that is determined by the etching of the body at the masking edge of the window, a portion of the surface region being left to provide the source region adjacent to the trench.

The method as set out in claim 1 includes quite different steps (a) to (f) from the method steps of U.S. Pat. No. 5,378,655. In particular, by diffusion of the dopant of the first conductivity type laterally below the trench-etch mask over a distance beyond the masking edge of the window, the source region is defined in a self-aligned manner with respect to the trench, without requiring any side-wall extension on the mask at the window. The absence of side-wall extensions can permit a more compact device structure. The etch edge definition for the trench can be better controlled by using the masking edge of a well-defined mask, as compared with the less well defined edges that tend to result with a side-wall extension (particularly if the extensions are kept short to provide a compact device). Side-wall extensions are conveniently formed of doped polycrystalline silicon or of silicon dioxide, which the inventors find to be often etched slightly by the etchant used for the trenches. In the method in accordance with the present invention, the mask can easily be chosen to comprise a material, for example silicon nitride, that is not etched by the etchant used for the trenches, and it can be well-defined using usual photolithographic and etching techniques. Even more important is the fact that any slight etching of the mask material in a method in accordance with the invention merely results in a slight thinning of the mask, as compared with an increase in window size resulting from a slight etching of side-wall extensions.

There is considerable flexibility in the specific technologies which can be used to form self-aligned structures of the mask together with, for example, an insulating overlayer over the gate in the trench. Such an insulating overlayer permits the source electrode to extend over the trench-gate, which is particularly advantageous in a compact cellular device structure.

Various preferred features in accordance with the invention are set out in claims 2 to 10.

BRIEF DESCRIPTION OF THE DRAWING

These and other features in accordance with the invention are illustrated in embodiments of the present invention, that are now to be described with reference to the accompanying diagrammatic drawings, in which.

Figure 1:
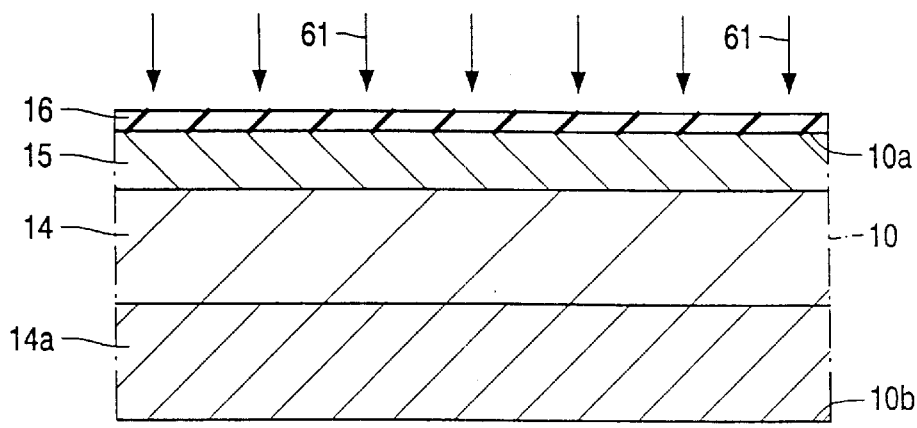
FIGS. 1 to 8 are a cross-sectional view of transistor cell areas of a semiconductor body at successive stages in the manufacture of a trench-gate semiconductor device by one example of a method in accordance with the present invention.

It should be noted that all the Figures are diagrammatic and not drawn to scale. Relative dimensions and proportions of parts of the drawings have been shown exaggerated or reduced in size, for the sake of clarity and convenience in the drawings. The same reference signs are generally used to refer to corresponding or similar features in different stages of manufacture and in modified and different embodiments.

DESCRIPTION OF THE PREFERRED EMBODIMENTS

Figure 8:
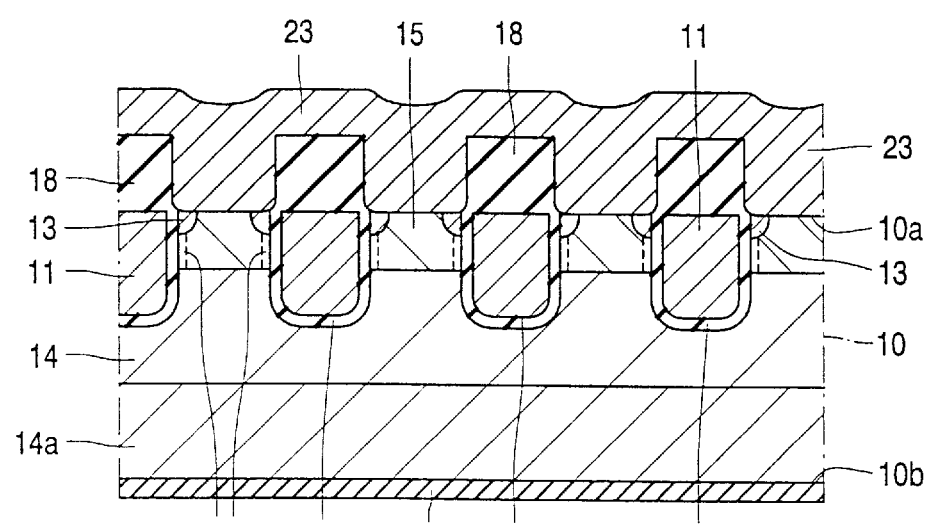

FIG. 8 illustrates an exemplary embodiment of a power semiconductor device having a trench-gate 11. In the transistor cell areas of this device, source and drain regions 13 and 14, respectively, of a first conductivity type (n-type in this example) are separated by a channel-accommodating body region 15 of the opposite second conductivity type (i.e. p-type in this example). The gate 11 is present in a trench 20 which extends through the regions 13 and 15 into an underlying portion of the drain region 14. The application of a voltage signal to the gate 11 in the on-state of the device serves in known manner for inducing a conduction channel 12 in the region 15 and for controlling current flow in this conduction channel 12 between the source and drain regions 13 and 14.

The source region 13 is contacted by a source electrode 23 at the top major surface 10a of the device body. By way of example, FIG. 8 shows a vertical device structure in which the region 14 may be a drain-drift region formed by an epitaxial layer of high resistivity (low doping) on a substrate region 14a of high conductivity. This substrate region 14a may be of the same conductivity type (n-type in this example) as the region 14 to provide a vertical MOSFET, or it may be of opposite conductivity type (p-type in this example) to provide a vertical IGBT. The substrate region 14a is contacted at the bottom major surface 10b of the device body by an electrode 24, called the drain electrode in the case of a MOSFET and called the anode electrode in the case of an IGBT.

Figure 2:
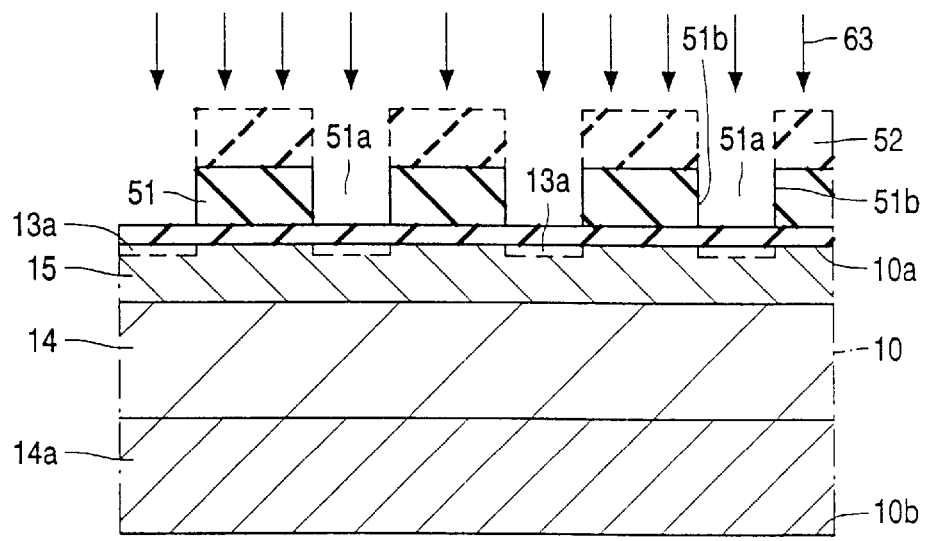
Figure 4:
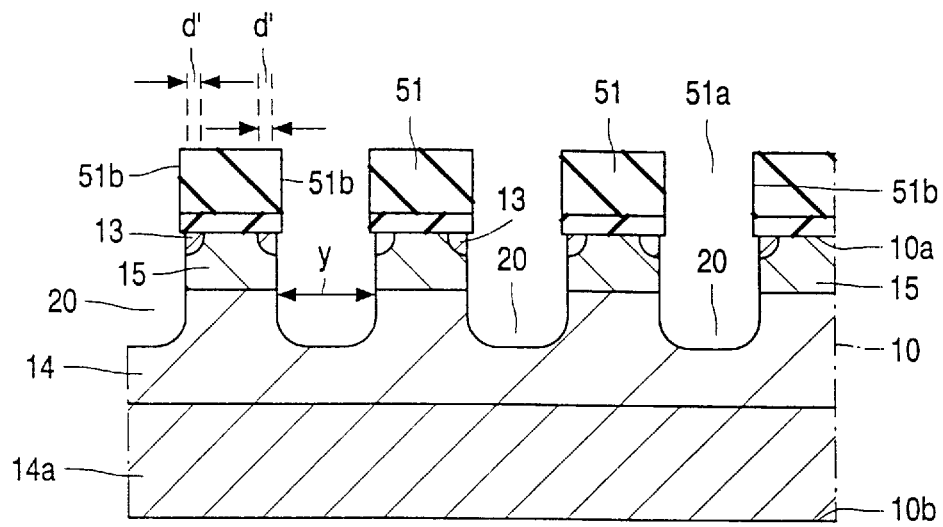
Figure 5:
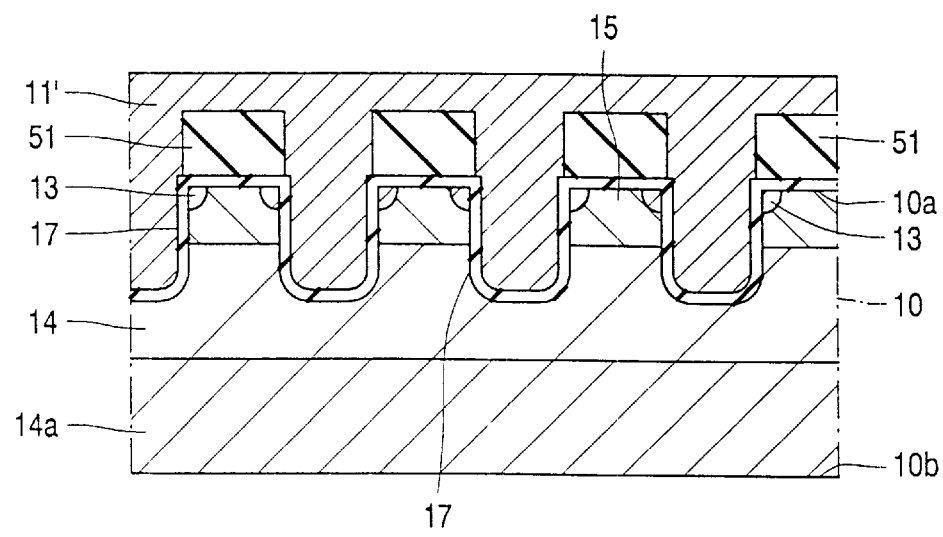

The device of FIG. 8 is manufactured by a method which, in overview of FIGS. 2 to 8, includes the steps of:

(a) forming at a surface 10a of a semiconductor body 10 (typically of monocrystalline silicon) a mask 51 having a window 51a at an area of the body region 15;

(b) introducing dopant 63 of the first conductivity type (donor dopant in this example) for the source region 13 into the said area via the window 51a as defined by a masking edge 51b of the window, see FIG. 2;

(c) diffusing the dopant 63 into the body region 15 so as to form a surface region 13b of the first conductivity type (n-type) that extends laterally below the mask 51 at a distance d beyond the masking edge 51b of the window 51a, see FIG. 3;

(d) etching a trench 20 into the body 10 at the window 51a to extend through the surface region 13b and body region 15 to an underlying portion of the drain region 14, the lateral extent (y) of the trench 20 being determined by the etching of the body 10 at the masking edge 51b of the window 51a to leave a portion of the surface region 13b as the source region 13 adjacent to the trench 20, see FIG. 4;

(e) depositing material 11' in the trench 20 to provide the gate 11 adjacent to where the channel 12 is accommodated in the body region 15, see FIG. 5; and (f) providing a source electrode 23 on the body 10 after removing the mask 51 so as to expose the source region 13 and an adjacent surface portion of the body region 15 for contacting by the source electrode 23, see FIG. 8.

Figure 6:
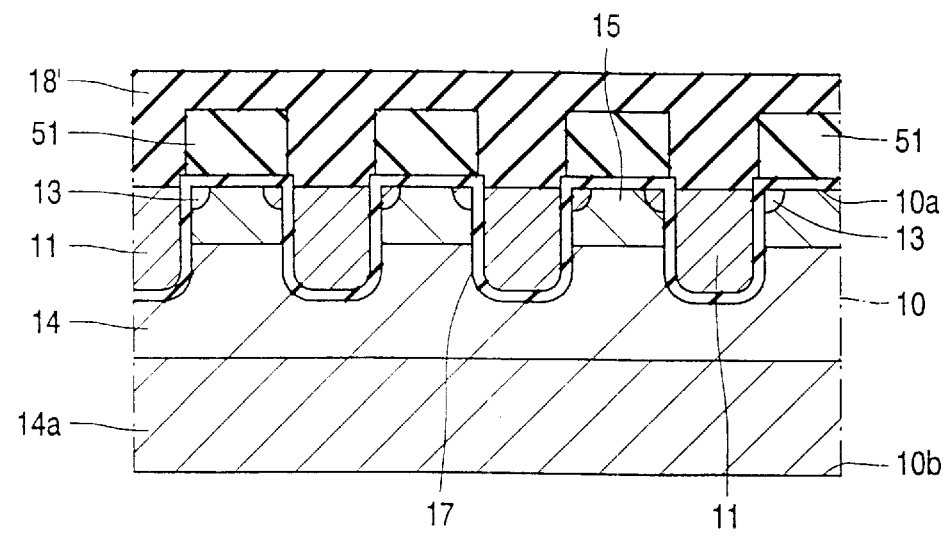
Figure 7:
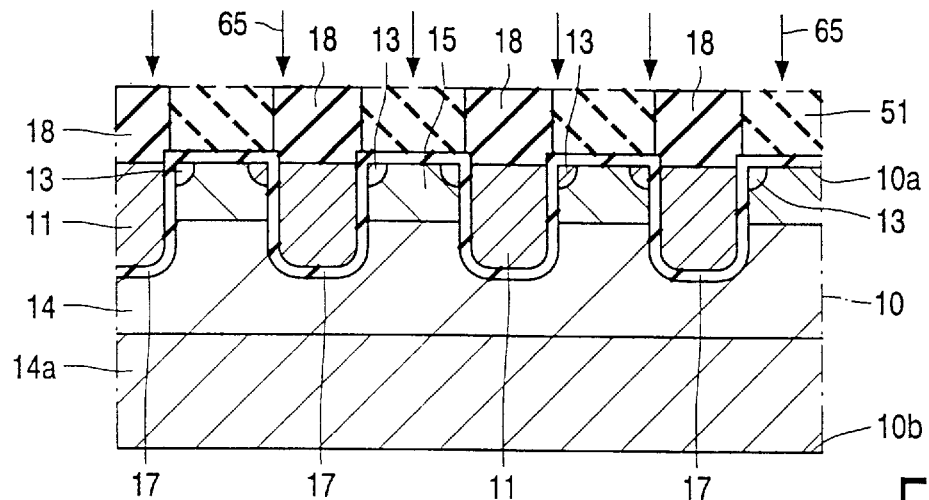
Figure 9:
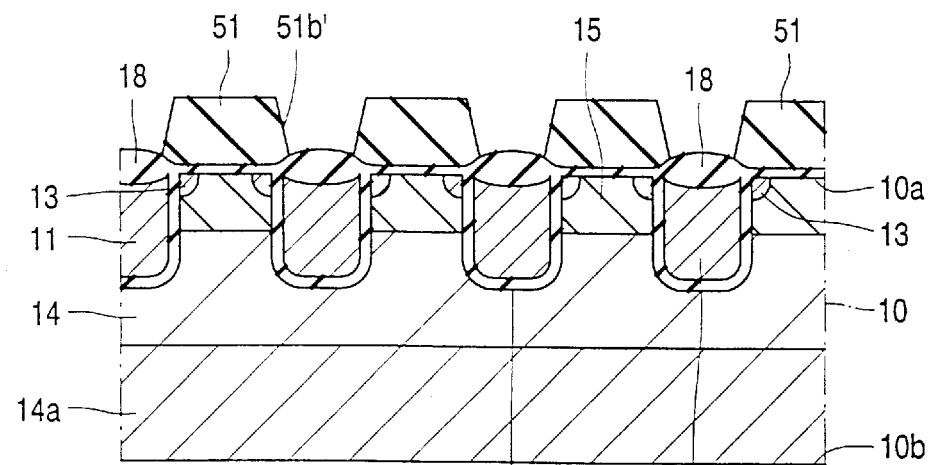
FIG. 9 is a cross-sectional view of the transistor cell areas of FIG. 5 at a subsequent stage in a modified manufacturing method also in accordance with the invention.

Furthermore, in the embodiments illustrated, a complementary masking technique is used to form an insulating overlayer 18 over the gate 11 before step (f), see FIGS. 7 and 9. This further reduces the requirement for separate mask alignments. The source electrode 23 provided in step (f) extends on the surface of the body 10 and also on the insulating overlayer 18. The lateral extent of the mask 51 (as determined in step (a) by, for example, a photoresist pattern 52) thus, defines the lateral extent of the insulating overlayer 18. Indeed the embodiments of FIGS. 1 to 9 are so designed that all the subsequent masking steps in the cell areas shown in FIGS. 1 to 9 can be determined in a self-aligned manner from the mask 51. This self-alignment permits a reproducible close spacing of the transistor cells, for example with a cell pitch of less than 2 $\mu$m, i.e. with a spacing of 2 $\mu$m (or less) between the centres of the neighbouring trenches 20.

No plan view of the cellular layout geometry is shown in the drawings, because the methods of FIGS. 1 to 9 may be used for quite different, known cell geometries. Thus, for example the cells may have a square geometry as illustrated in FIG. 14 of U.S. Pat. No. 5,378,655, or they may have a close-packed hexagonal geometry or an elongate stripe geometry. In each case, the trench 20 (with its gate 11) extends around the boundary of each cell. FIG. 8 shows only a few cells, but typically the device comprises many hundreds of these parallel cells between the electrodes 23 and 24. The active cellular area of the device may be bounded around the periphery of the body 10 by various known peripheral termination schemes (also not shown). Such schemes normally include the formation of a thick field-oxide layer at the peripheral area of the body surface 10a, before the transistor cell fabrication steps. Furthermore, various known circuits (such as gate-control circuits) may be integrated with the device in an area of the body 10, between the active cellular area and the peripheral termination scheme. Typically their circuit elements may be fabricated with their own layout in this circuit area using some of the same masking and doping steps as are used for the transistor cells.

Successive stages in the fabrication of the transistor cells of FIG. 8 will now be described with reference to FIGS. 1 to 8.

FIG. 1 illustrates the stage in which a p-type region 15 is formed in the low-doped n-type region 14 by implantation of acceptor dopant ions 61, for example of boron. The implantation is carried out in the active cellular area defined by a window in the thick field-oxide layer (not shown). A thin layer 16 of silicon dioxide may be grown on the silicon body surface 10a, before implanting the ions 61. A heating step may be carried out to diffuse the implanted dopant to the desired depth for the region 15 in the body 10. This heating step may be delayed until after the ion implantation and diffusion illustrated in FIGS. 2 and 3. However, instead of forming the p-type body region 15 by ion implantation 61, it may alternatively be epitaxially grown as a p-type epitaxial layer 15 on the low-doped n-type region 14, itself an epitaxial layer.

As illustrated in FIG. 2, the mask 51 is now provided at the body surface 10a. This mask 51 may be formed in a standard manner using photolithography and etching. First a continuous layer 51' of the mask material is formed by deposition of, for example, silicon nitride material using known plasma enhanced chemical vapour deposition (PECVD) techniques. The mask pattern is then defined in a photoresist layer 52' on the mask layer 51', by spinning a photoresist material onto the mask layer 51', selectively exposing and then developing the photoresist layer 52' to form a photoresist pattern 52 having windows 51a, and subsequently etching away the mask layer 51' where exposed at the windows so as to transfer the window pattern of the photoresist 52 to the resulting mask 51. In this way, a well defined window-edge 51b can be formed for the nitride mask 51, as defined by the photoresist pattern 52 formed in the photolithography stage.

The thickness of the nitride mask 51 may be, for example, in the range of 0.1 $\mu$m to 0.5 $\mu$m. Preferably a thin oxide layer is present below the nitride mask 51, so as to prevent this thick nitride material from causing too much stress in the underlying monocrystalline silicon. The oxide layer 16 of FIG. 1 may be retained as this thin oxide layer. The nitride mask 51 is, for example, a pattern of hexagonal dot (pillars) if an hexagonal geometry device is being manufactured. In this case, the windows 51a form an hexagonal grid pattern and may be, for example 0.5 $\mu$m to 1.0 $\mu$m in width.

An implantation of donor ions 63 (for example of phosphorous or arsenic) is now carried out to form implanted regions 13a in the body region 15 at the windows 51a. The nitride mask 51 is of sufficient thickness to mask the underlying surface areas against this implantation of the donor ions 63, except at the windows 51a. The photoresist pattern 52 may be removed before this implantation 63, or it may form part of the implantation mask if a thinner nitride layer is used for the mask 51. In either case, care should be taken to ensure that the edge of the implanted region 13a is well defined by the edge 51a of the window 51a. Thus, as illustrated in FIG. 2, these implanted regions 13a are self-aligned in a precise complementary manner with the nitride mask 51.

Figure 3:
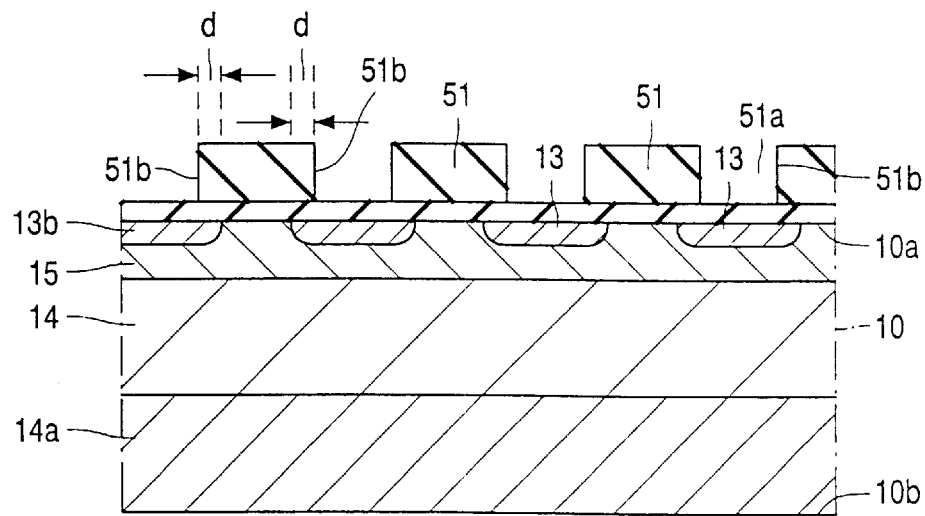

A heating treatment for annealing and diffusing this donor implant 13a is now carried out, as illustrated in FIG. 3. As can be seen from FIG. 3, the resulting n-type regions 13b extend laterally below the mask 51 at a distance d beyond the masking edge 51b of the window 51a. These diffused regions 13b form an hexagonal grid pattern in the case of hexagonal geometry cells. In a typical example, the heating may be carried out for a sufficient time to diffuse the implanted dopant over a lateral distance d of 0.1 $\mu$m to 0.5 $\mu$m.

As illustrated in FIG. 4, an etching treatment is now carried out at the windows 51a of the mask 51. When a thin oxide layer (such as 16) is present, this oxide layer is first etched away at the windows 51a. A silicon-etching treatment is then carried out in known manner, using the silicon nitride mask 51 as an etchant mask, to etch the trench 20 into the silicon body 10 at the windows 52a. The resulting structure is illustrated in FIG. 4. The layout pattern of the trench 20 is an hexagonal grid when an hexagonal geometry device is being manufactured. The remaining portions of the diffused regions 13b that adjoin the trench 20 form the source regions 13 of the transistor cells. The lateral extent d' of the source region 13 is determined by the extent to which the trench etching extends under the mask 51 beyond the edge 51b. This can be well-controlled using anisotropic plasma etching for at least most of the depth of the trench 20. However, it can be advantageous to use a final brief isotropic etch in order to round the bottom corners of the trench 20. The width y of the etched trench 20 may be, for example, in the range of 0.5 $\mu$m to 1.0 $\mu$m.

The silicon body 10 is now subjected to an oxidation treatment to form a thin silicon dioxide layer 17 on the exposed faces of the trench 20. During this stage, the silicon nitride mask 52 serves to mask the silicon surface 10a against oxidation. As illustrated in FIG. 5, doped polycrystalline silicon 11' may now be deposited in known manner in the windows 51a and on the nitride mask 51. This deposited polycrystalline silicon 11' is then etched back until, using the nitride mask 51 as an etchant mask, the material 11' is left only in the trench 20 where it is to form the gate 11.

As illustrated in FIG. 6, a layer 18' of silicon dioxide is then deposited in a thickness sufficient to fill the mask windows 51a over the gate 11 and to have a substantially flat upper surface The silicon dioxide layer 18' is then subjected to a known planarizing etch treatment, which etches back the layer 18' to re-expose the nitride mask 51. This etch-back leaves a silicon dioxide overlayer 18 in the mask windows 51a over the gate 11. the resulting structure is illustrated in FIG. 7.

The silicon nitride mask 51 is now removed from the surface 10a by etching, and the silicon surface 10a is exposed between the insulating overlayers 18 on the trench-gates 11. When a thin oxide layer 16 is present on the body surface 10a, an oxide etching treatment is carried out to remove the layer 16. This oxide etching treatment also thins slightly the insulating overlayers 18.

Electrode material (for example aluminium) is now deposited to provide the source electrode 23 in contact with the exposed silicon surface 10a of the regions 13 and 15. The lateral extent of the source electrode 23 is determined in known manner by photolithographic definition and etching of the deposited electrode material. As illustrated in FIG. 8, the source electrode 23 can also extend on the insulating overlayer 18 over the trench-gate 11.

As illustrated by arrows 65 in FIG. 7, dopant of the second conductivity type (acceptor dopant in this example) may be introduced into the body region 15 after removing the mask 51 and before providing the source electrode 23. This doping stage may be carried out by implanting boron ions. The ion dose is insufficient to over-dope the source regions 13, but it does increase the doping concentration of the body region 15 adjacent to the surface 10a. It is this surface-adjacent portion that is contacted by the source electrode 23. In this way, the surface-adjacent portion of the body region 15 can be made more highly doped than the portion of the body region 15 that accommodates the channel 12. However, instead of introducing extra dopant at this late stage in the manufacture, the surface-adjacent portion of the body region 15 can be made more highly doped at an earlier stage, for example in the implantation of FIG. 1 or during epitaxial growth of the body region 15.

It will be evident that many variations and modifications are possible within the scope of the present invention. In the embodiment of FIGS. 6 and 7, deposition and etch-back are used to provide the insulating overlayer 18 in a self-aligned manner. An alternative self-aligned process is illustrated in FIG. 9, in which an upper portion of the silicon gate material in the trench 20 is oxidised to form the insulating overlayer 18 of silicon dioxide over the gate 11. The oxidation is carried out after etching back the gate material from the mask 51 and the top of the trench 20. During this oxidation, the silicon nitride mask 51 protects the silicon body areas between the trenches 20 from being oxidised. The resulting structure is illustrated in FIG. 9.

The mask edges 51b are distorted by this oxidation, as illustrated by 51b' in FIG. 9. The distortion occurs because the grown oxide 18 occupies a larger volume than the upper part of the silicon material before it was oxidised. However, the mask edge 51b is undistorted and well defined during the earlier stages of providing the source-doping regions 13a, 13b and 13 and the trench 20, as in FIGS. 2 to 4. Although the FIG. 9 embodiment is practical, the oxidation does result in some lateral growth of the oxide layer 18 under the mask edge 51b and some further diffusion of the source region 13. As a result, this embodiment can be harder to control with regard to the lateral extent of the source region 13 and of the intermediate surface-adjacent part of the body region 15, and the location of the edge of the contact window in the oxide layer 18 for the source electrode 23. Thus, an embodiment such as FIGS. 6 and 7 may be preferred, with an insulating overlayer 18 formed by deposition of an insulating material that is differentially etchable with respect to the material of the mask 51.

Usually the conductive gate 11 is formed of doped polycrystalline silicon as described above. However, other known gate technologies may be used in particular devices. Thus, for example, additional materials may be used for the gate, such as a thin metal layer that forms a silicide with the polycrystalline silicon material. Alternatively, the whole gate 11 may be of a metal instead of polycrystalline silicon. FIGS. 5 to 9 illustrate the preferred situation of an insulated gate structure, in which the conductive gate 11 is capacitively coupled to the channel-accommodating body region 15 by a dielectric layer 17. However, so-called Schottky gate technologies may alternatively be used. In this case, a gate dielectric layer 17 is absent and the conductive gate 11 is of a metal that forms a Schottky barrier with the low-doped channel-accommodating portion of the body region 15. The Schottky gate 11 is capacitively coupled to the channel-accommodating region 15 by the depletion layer present at the Schottky barrier.

FIG. 8 illustrates a device having a p-type body region 15 of a uniform depth in each cell, without any deeper, more highly doped (p+) region such as is often used to improve device ruggedness. Some of the cells (not shown) of the device of FIG. 8 may comprise a deeper, more highly doped (p+) region instead of the channel-accommodating region 15. These deeper, more highly doped (p+) regions may be implanted through windows of an appropriate mask, for example before the FIG. 1 stage or in a modification of the FIG. 7 stage. It is also possible to implant a deeper, more highly doped (p+) localised region within an active cell having a channel-accommodating region 15, but the cell geometry is less compact in this case.

The particular example described above is an n-channel device, in which the regions 13 and 14 are of n-type conductivity, the region 15 is of p-type, and an electron inversion channel 12 is induced in the region 15 by the gate 11. By using opposite conductivity type dopants, a p-channel device can be manufactured by a method in accordance with the invention. In this case, the regions 13 and 14 are of p-type conductivity, the regions 15a and 15b are of n-type, and a hole inversion channel 12 is induced in the region 15a by the gate 11.

Similar processing steps may even be used to manufacture an accumulation-mode device in accordance with the invention. Such a device of the p-channel type has p-type source and drain regions 13 and 14a, and a p-type channel-accommodating region 15. It may also have an n-type deep localised region within each cell. N-type polycrystalline silicon may be used for the gate 11. In operation, a hole accumulation channel 12 is induced in the region 15 by the gate 11 in the on-state. The low-doped p-type region 15 may be wholly depleted in the off-state, by depletion layers from the insulated gate 11 and from the deep n-type region.

A vertical discrete device has been illustrated with reference to FIGS. 1 to 9, having its second main electrode 24 contacting the region 14a at the back surface 10b of the body 10. However, an integrated device is also possible in accordance with the invention. In this case, the region 14a may be a doped buried layer between a device substrate and the epitaxial low-doped drain region 14. This buried layer region 14a may be contacted by an electrode 24 at the front major surface 10a, via a doped peripheral contact region which extends from the surface 10a to the depth of the buried layer.

From reading the present disclosure, other variations and modifications will be apparent to persons skilled in the art. Such variations and modifications may involve equivalent and other features which are already known in the design, manufacture and use of semiconductor devices and which may be used instead of or in addition to features already described herein.

Although Claims have been formulated in this Application to particular combinations of features, it should be understood that the scope of the disclosure of the present invention also includes any novel feature or any novel combination of features disclosed herein either explicitly or implicitly or any generalisation thereof, whether or not it relates to the same invention as presently claimed in any Claim and whether or not it mitigates any or all of the same technical problems as does the present invention.

The Applicants hereby give notice that new Claims may be formulated to any such features and/or combinations of such features during the prosecution of the present Application or of any further Application derived therefrom.

What is claimed is:

1. A method of manufacturing a trench-gate semiconductor device having source and drain regions of a first conductivity type which are separated by a channel-accommodating body region adjacent to the trench-gate, including the steps of:

(a) forming at a surface of a semiconductor body a mask having a window at an area of the body region, (b) introducing dopant of the first conductivity type for the source region into the said area via the window as defined by a masking edge of the window, (c) diffusing the dopant of the first conductivity type into the body region so as to form a surface region of the first conductivity type that extends laterally below the mask at a distance beyond the masking edge of the window, (d) etching a trench into the body at the window to extend through the surface region and body region to an underlying portion of the drain region, the lateral extent of the trench being determined by the etching of the body at tile masking edge of the window to leave the source region adjacent to the trench, (e) depositing material in the trench to provide the gate adjacent to where the channel is accommodated in the body region, and (f) providing a source electrode on the body after removing the mask so as to expose the source region and an adjacent surface portion of the body region for contacting by the source electrode, wherein no intervening step occurs between the introducing step and the diffusing step.

2. A method as claimed in claim 1, wherein an insulating overlayer is formed over the gate before step (f), and the source electrode provided in step (f) extends on the surface of the body and also on the insulating overlayer.

3. A method as claimed in claim 2, wherein the insulating overlayer is formed by deposition of insulating material in the window of the mask, and the mask is selectively etchable with respect to the insulating material of the overlayer thereby permitting removal of the mask while leaving the overlayer over the gate in the trench.

4. A method as claimed in claim 2, wherein the insulating material of the overlayer is selectively etchable with respect to the mask thereby permitting removal of the insulating overlayer from over the mask while leaving the insulating material of the overlayer in the window of the mask.

5. A method as claimed in claim 1, wherein silicon material is deposited on an insulating layer in the trench to form the gate in step (e).

6. A method as claimed in claim 1, wherein silicon material is deposited on an insulating layer in the trench to form the gate in step (e), an upper portion of the silicon material is oxidised to form an insulating overlayer over the gate before step (f), and the source electrode provided in step (f) extends on the surface of the body and also on the insulating overlayer.

7. A method as claimed in claim 1 wherein the mask comprises silicon nitride on a thinner layer of silicon dioxide.

8. A method as claimed in any claim 1 wherein the channel-accommodating body region is a region is of an opposite, second conductivity type.

9. A method as claimed in claim 8, wherein said adjacent surface of the body region that is contacted by the source electrode in step (f) is more highly doped than the channel-accommodating portion of the body region and is formed by introducing dopant of the second conductivity type into the body after removing the mask and before providing the source electrode.

10. A trench-gate semiconductor device manufactured by a method as claimed in claim 1.

* * * * *